United States Patent
Blossfeld

(10) Patent No.: US 7,083,434 B1
(45) Date of Patent: Aug. 1, 2006

(54) ELECTRICAL APPARATUS WITH COMPLIANT PINS

(75) Inventor: Mike Blossfeld, South Lyon, MI (US)

(73) Assignee: TRW Automotive US LLC, Livonia, MI (US)

( * ) Notice: Subject to any disclaimer, the term of this patent is extended or adjusted under 35 U.S.C. 154(b) by 0 days.

(21) Appl. No.: 11/077,456

(22) Filed: Mar. 10, 2005

(51) Int. Cl.
*H01R 12/00* (2006.01)
*H05K 1/00* (2006.01)

(52) U.S. Cl. .................. 439/82; 439/751; 200/284
(58) Field of Classification Search ............ 439/82, 439/751, 84; 200/284
See application file for complete search history.

(56) References Cited

U.S. PATENT DOCUMENTS

| | | | | |
|---|---|---|---|---|
| 3,710,060 A | * | 1/1973 | Brevick | 200/243 |
| 3,809,838 A | * | 5/1974 | Coppola | 200/532 |
| 4,381,134 A | * | 4/1983 | Anselmo et al. | 439/444 |
| 4,878,861 A | * | 11/1989 | Kendall et al. | 439/751 |
| 5,055,072 A | * | 10/1991 | Shinoda | 439/751 |
| 6,175,090 B1 | * | 1/2001 | Blossfeld | 200/558 |
| 6,450,839 B1 | * | 9/2002 | Min et al. | 439/751 |
| 2004/0112730 A1 | * | 6/2004 | Blossfeld | 200/284 |
| 2005/0087429 A1 | * | 4/2005 | Blossfeld | 200/5 R |
| 2005/0090155 A1 | * | 4/2005 | Blossfeld | 439/751 |

FOREIGN PATENT DOCUMENTS

| | | | |
|---|---|---|---|
| EP | 1081730 A2 | * | 3/2001 |
| EP | 1431992 A2 | * | 6/2004 |
| EP | 1526559 A1 | * | 4/2005 |

* cited by examiner

*Primary Examiner*—Hae Moon Hyeon
(74) *Attorney, Agent, or Firm*—Tarolli, Sundheim, Covell & Tummino LLP

(57) ABSTRACT

An improved electrical apparatus concludes a manually actuatable electrical device which is disposed on a printed circuit board and has a manually movable control element. A plurality of electrical current conducting compliant pins extend into engagement with conductive linings in openings in the printed circuit board. The electrical apparatus is free of solder connecting the compliant pins to the conductive linings in the openings in the printed circuit board.

6 Claims, 2 Drawing Sheets

ELECTRICAL APPARATUS WITH COMPLIANT PINS

BACKGROUND OF THE INVENTION

The present invention relates to a new and improved electrical apparatus which is connected with a printed circuit board by compliant pins.

Electrical devices, such as modular switches, sub assemblies, potentiometers, and/or encoders, are becoming a trend in the automotive industry and the designs vary according to the technologies each company favors. A common feature of these devices is to utilize a printed circuit board buss system installed on an insert molded base to buss the electrical current for the electrical devices. These electrical devices are usually soldered using hand solder, wave solder, and/or selective solder methods.

This process is sometimes problematic due to the use of solder flux, excess heat, and/or contamination through the soldering practices. This also creates additional solder operations which in turn increase assembly cost. Other problems with soldering include additional failure points for each solder joint and the practice of "touch-up" soldering which increases the heat to which the printed circuit board is exposed. It is believed that it would be advantageous to eliminate or reduce the amount of solder operations utilized during construction of a vehicle.

SUMMARY OF THE INVENTION

The present invention relates to a new and improved electrical apparatus which includes a printed circuit board having a plurality of openings with conductive linings. A plurality of electrical current conducting compliant pins extend from an electrical device into openings in the printed circuit board. Each of the compliant pins is disposed in engagement with a conductive lining in one of the openings in the printed circuit board. Each compliant pin provides an electrically conductive path between the lining and the electrical device. The electrical apparatus is free of solder connecting the compliant pins to the conductive linings in the openings in the printed circuit board.

The electrical device may advantageously include a housing which is formed of a polymeric material which is not high temperature resistant. By utilizing compliant pins to mount the housing on the printed circuit board without soldering, the possibility of exposing the housing to excessive temperatures is minimized.

An electrical apparatus constructed in accordance with the present invention may be used in many different environments. It is contemplated that the apparatus will be particularly useful in association with vehicles, such as an automotive vehicle. It is contemplated that the apparatus will be utilized to control the operation of many different types of devices. For example, the apparatus may be utilized to control the raising and lowering of a window in a vehicle. Alternatively, the apparatus may be utilized to control lighting within the vehicle. Of course, the apparatus may be used to control other functions. It should be understood that the foregoing are only some examples of uses for an apparatus constructed in accordance with the present invention and it is believed that the apparatus will be utilized for many other purposes.

BRIEF DESCRIPTION OF THE DRAWINGS

The foregoing and other features of the invention will become more apparent upon a consideration of the following description taken in connection with the accompanying drawings wherein.

DESCRIPTION OF SPECIFIC PREFERRED EMBODIMENTS OF THE INVENTION

Figure 1:
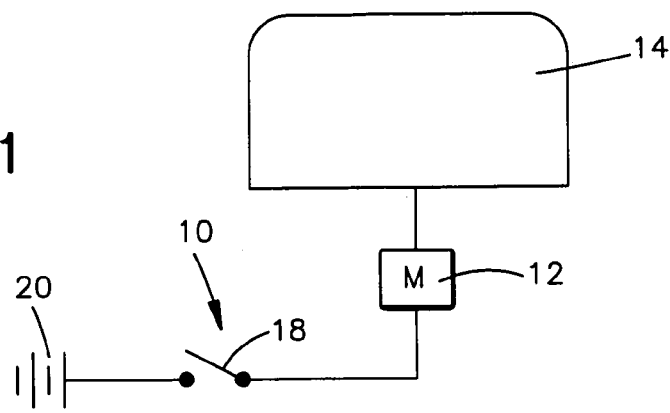
FIG. 1 is a schematic illustration depicting the manner in which an apparatus constructed in accordance with the present invention may be utilized to control the raising and lowering of a window in a vehicle.

An electrical apparatus 10 constructed in accordance with the present invention is illustrated in FIG. 1 in association with a motor 12 which is operable to raise and lower a window 14 in a vehicle. Although the electrical apparatus 10 has been illustrated in FIG. 1 in association with a motor 12 which raises and lowers the window 14, it is contemplated that the electrical apparatus may be utilized in association with many different devices for many different purposes. For example, the electrical apparatus 10 may be utilized to control lights in a vehicle. Alternatively, the electrical apparatus 10 may be utilized to control the operation of a sun roof or the remote opening of a trunk lid.

When the electrical apparatus 10 is operated, an electrically conducting element or switch 18 is closed. Closing the switch 18 completes a circuit between a battery 20 and a motor 12. Closing of the switch 18 results in operation of the motor 12 to raise or lower the window 14.

The apparatus 10 includes a printed circuit board 24 (FIG. 2) and an electrical device 26. The electrical device 26 is mounted on and electrically connected with the printed circuit board 24 by compliant pins 30 and 32. The compliant pins 30 and 32 are pressed fitted into cylindrical openings 36 and 38 in a printed circuit board 24.

The compliant pin 30 engages a tubular cylindrical electrically conductive lining 42 which defines the opening 36. The lining 42 is disposed in engagement with a side surface of a cylindrical opening 44 in the printed circuit board 24. The lining 42 is fixedly connected with the side surface of the opening 44 in the printed circuit board. The lining 42 extends between parallel upper and lower major side surfaces 48 and 50 of a printed circuit board 24. The lining 42 is formed of an electrically conductive material, that is, metal.

Similarly, the opening 38, which receives the complaint pin 32, is defined by a tubular cylindrical electrically conductive lining 54. The lining 54 is disposed in a cylindrical opening 56 in the printed circuit board 24. The lining 54 is fixedly connected to a cylindrical side surface of the opening 56 in the printed circuit board 24. The lining 54 extends between the opposite major side surfaces 48 and 50 of the printed circuit board. The lining in 54 is conductive of an electrically formed material, that is, metal. The tubular cylindrical linings 42 and 54 have parallel central axes which extend perpendicular to the major side surfaces 48 and 50 of the printed circuit board 24.

The lining 42 is connected to a metal conductor or trace 62 (FIG. 2) disposed on the lower major side surface 50 of the printed circuit board 24. The conductor 62 is connected with the motor 12. The conductor 62 is electrically insulated from the lining 54 by the electrically insulating material of the printed circuit board 24.

The lining 54 is connected with the battery 20 by a second metal conductor or trace 66 which is disposed on the lower major side surface 50 of the printed circuit board 24. The conductor 66 is connected with the battery 20 and electrically connects the battery with the lining 54. The conductor 66 is spaced from the conductor 62 and the lining 42. The conductor 66 is electrically insulated from the conductor 62 and lining 42 by the electrically insulating material of the printed circuit board 24.

The compliant pins 30 and 32 are metal connector pins having compliant sections. The compliant sections of the compliant pins 30 and 32 are resiliently compressed when the compliant pins 30 and 32 are telescopically inserted into the openings 36 and 38 in the printed circuit board 24. The compliant pins 30 and 32 have parallel central axes which are coincident with the parallel central axes of the linings 42 and 54 when the compliant pins 30 and 32 are telescopically disposed within the linings 42 and 54 in the manner illustrated in FIG. 2. The resiliently compressed compliant pins 30 and 32 press firmly against the inner side surfaces of the tubular cylindrical linings 42 and 54 to provide the solid electrical connection between the compliant pins and the linings.

The compliant pins 30 and 32 are fixedly connected to an electrically insulating housing 72 (FIGS. 2 and 3) of the electrical device 26. The housing 72 encloses the electrical switch 18. The switch 18 is of the push—push type. Thus, upon manual actuation of an actuator 78 (FIG. 3) the switch 18 (FIG. 2) is operated from an open condition to a closed condition. The switch 18 remains in the closed condition until the actuator 78 is again manually depressed. Thus, the switch 18 is of the alternate action type. However, the switch 18 may be of the momentary action type if desired.

The housing 72 is advantageously formed of a polymeric material which is not high temperature resistant. Thus, the housing 72 is formed of a polymeric material which melts at a temperature above about 200 degrees Centigrade. It is contemplated that the housing 72 may be formed of any one of many known polymeric materials which are not high temperature resistant. For example, the housing 72 may be formed of nylon. However, it should be understood that the housing may be formed of any desired polymeric material.

The electrically conductive joints between the compliant pins 30 and 32 and the metal linings 42 and 54 in the openings 44 and 56 in the printed circuit board 24 are free of solder. Therefore, it is not necessary to heat the compliant pins 30 and 32 and/or the linings 42 and 54 disposed in the openings 34 and 56 in the printed circuit board 24. Since the connection between the compliant pins 30 and 32 and the printed circuit board 24 is free of solder, the housing 72 is not exposed to high temperatures and may be made of a material which is not high temperature resistant.

Eliminating soldering eliminates joints which may fail in extreme environmental conditions, such as thermal shock and/or vibration. In addition, the elimination of soldering enables relatively inexpensive materials which are not high temperature resistant, to be used for the housing 72. In addition to eliminating soldering operations, the compliant pins 30 and 32 allow a precise datum to be utilized and reduces tolerance stack ups to thereby facilitate production of the electrical apparatus 10.

The compliant pins 30 and 32 are fixedly connected with the housing 72 by embedding end portions 82 and 84 of the compliant pins 30 and 32 in the polymeric material of the housing 72. If desired, one or more flanges may be provided on the end portions 82 and 84 of the compliant pins 30 and 32 to facilitate the obtaining of a solid connection between the compliant pins and the housing 72. The end portions 82 and 84 of the compliant pins are electrically insulated by the polymeric material of the housing 72. The end portions 82 and 84 of the compliant pins 30 and 32 are connected with the switch 18 by suitable electrical conductors which are enclosed by the housing 72.

When the actuator 78 (FIG. 3) is manually operated to actuate the switch 18 (FIG. 2), force is transmitted from the actuator to the housing 72. This force is transmitted from the housing 72 through the compliant pins 30 and 32 to the printed circuit board 24. The compliant pins 30 and 32 are fixedly secured to the housing 72 at joints which are strong enough to withstand side wise and/or rocking forces applied to the actuator 78 during manual actuation of the electrical device 26.

Figure 2:
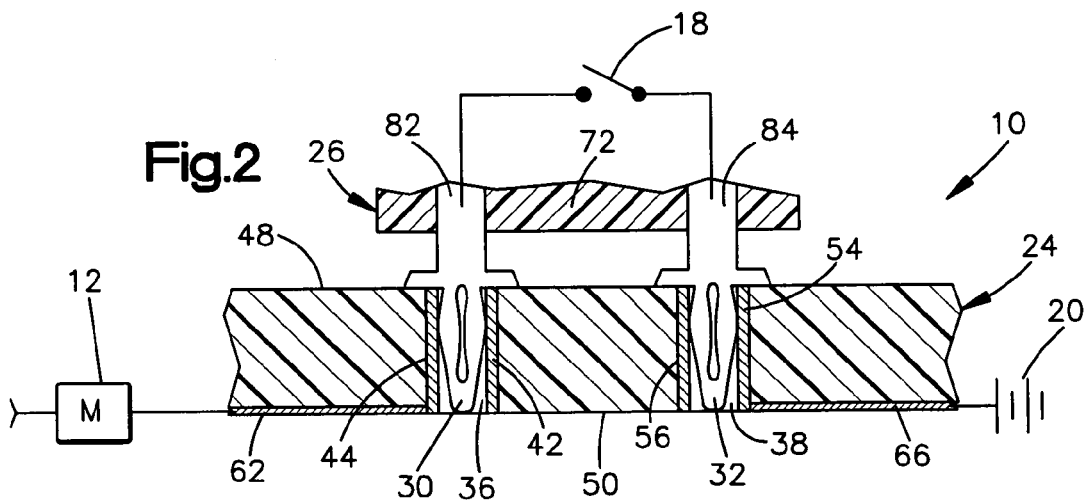
FIG. 2 is an enlarged schematic illustration of a portion of the apparatus of FIG. 1.
Figure 3:
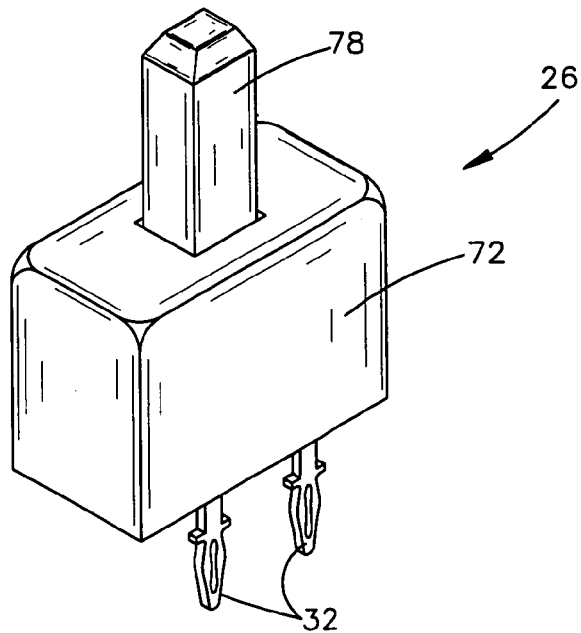
FIG. 3 is a schematic pictorial illustration of an electrical device utilized in the apparatus of FIGS. 1 and 2.
Figure 4:
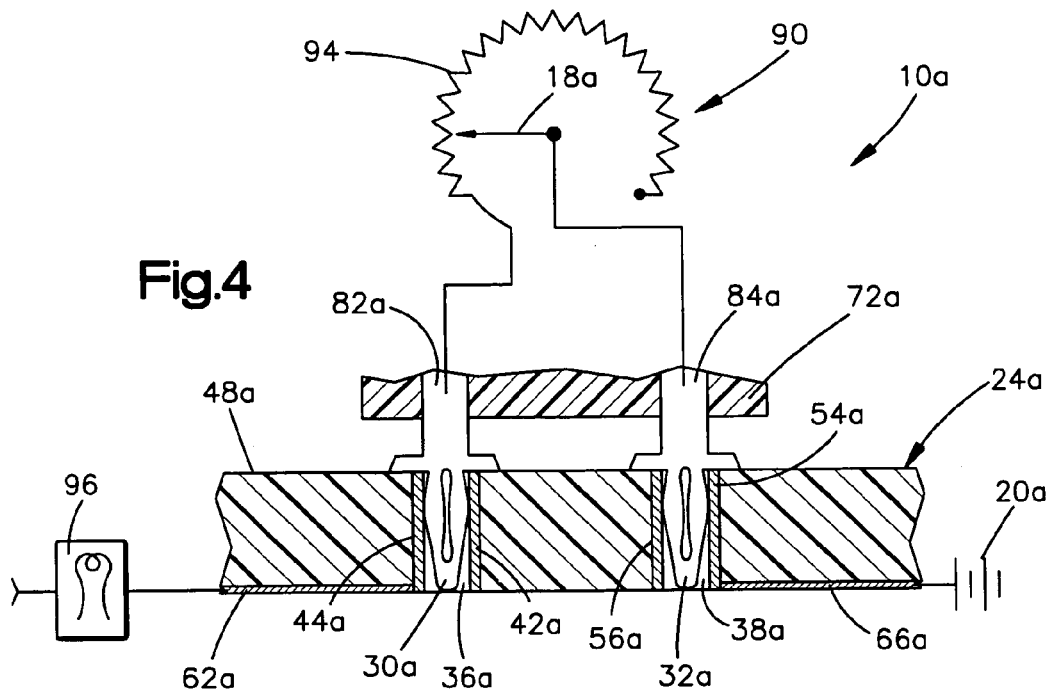
FIG. 4 is a schematic illustration, generally similar to FIG. 2, of a second embodiment of an apparatus constructed in accordance with the present invention.

In the embodiment of the invention illustrated in FIGS. 1–3, the electrical apparatus 10 is associated with a motor 12. In the embodiment of the invention illustrated in FIGS. 4 and 5, the electrical apparatus is associated with a potentiometer. Since the embodiment of the invention illustrated in FIGS. 4 and 5 is generally similar to the embodiment of the invention illustrated in FIGS. 1–3, similar numerals will be utilized to designate similar components, the suffix letter "a" being associated with the numerals of FIGS. 4 and 5 to avoid confusion.

An electrical apparatus 10*a* (FIG. 4) includes a potentiometer 90. The potentiometer 90 includes a rotary switch 18*a* which is movable along a resistance 94. Manual actuation of the switch 18*a* is effective to vary the resistance of the potentiometer 90 and the current conducted from the potentiometer to a source 96 of light. Upon operation of the rotary switch 18*a*, the intensity of the light emitted by the source 96 of light is varied. The source 96 of light may be disposed in a vehicle, for example, on a dashboard of a vehicle.

Figure 5:
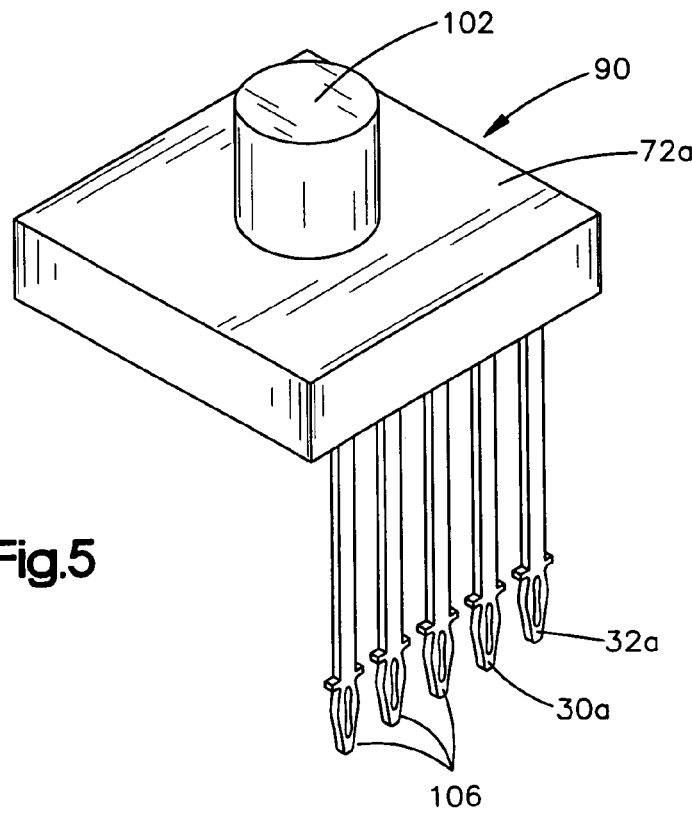
FIG. 5 is a schematic pictorial illustration of a portion of the apparatus of FIG. 4.

The potentiometer 90 is an electrical device having a manually movable control element 102 (FIG. 5). The potentiometer 90 includes a housing 72*a* which encloses the rotary switch 18*a* and resistance 94. If desired, the potentiometer 90 may be mounted on a dashboard of a vehicle.

A plurality of electrical current conductive compliant metal pins 30*a* and 32*a* are connected with the housing 72*a*. The compliant pins 30*a* and 32*a* extend from the housing 72*a* into a printed circuit board 24*a* (FIG. 4). The printed circuit board 24*a* includes a cylindrical opening 36*a* into which the compliant pin 30*a* is pressed fitted and a cylindrical opening 38*a* into which the compliant pin 32*a* is pressed fitted. The cylindrical openings 36*a* and 38*a* have parallel central axes which are coincident with the parallel central axes of the complaint pins 30*a* and 32*a* when the compliant pins have been pressed fitted into the openings.

The cylindrical opening 36*a* is defined by a tubular cylindrical metal lining 42*a*. The metal lining 42*a* is disposed in a cylindrical opening 44*a* formed in the printed circuit board 24*a*. The metal lining 42*a* is fixedly connected to a cylindrical side surface of the opening 44*a*.

Similarly, the opening 38*a* is defined by a tubular cylindrical metal lining 54*a*. The metal lining 54*a* is disposed in a cylindrical opening 56*a* in the printed circuit board 24*a*.

The metal lining 54a is fixedly connected to a cylindrical side surface of the opening 56a.

Although only the openings 36a and 38a and the compliant pins 30a and 32a have been illustrated in FIG. 4, it should be understood that the printed circuit board 24a may contain a greater number of openings for a greater number of compliant pins. For example, the circuit board 24a may be provided with openings for compliant pins 106 (FIG. 5) which extend from the housing 72a. Of course, a greater or lesser number of compliant pins may be provided if desired.

The printed circuit board 24a has parallel upper and lower major side surfaces 48a and 50a. A metal conductor or trace 62a is mounted on the lower major side 50a of the printed circuit board 24a. The metal conductor or trace 62a connects the metal lining 42a with the source 96 of light. Similarly, a second metal conductor or trace 66a is disposed on the lower major side 50a of the printed circuit board 24a. The metal conductor 66a connects the metal lining 54a with a battery 20a.

The connections between the compliant pins 30a and 32a are free of solder. Therefore, the housing 72a may be formed of a polymeric material which is not high temperature resistant. Specifically, the housing 72a is formed of a material which melts at a temperature of above about 200 degrees Centigrade. Although the housing 72a may be formed of many different polymeric material which are not high temperature resistant, the housing 72a is formed of nylon.

The compliant pin 30a has an end portion 82a which is embedded in the polymeric material of the housing 72a. If desired, the end portion 82a of the compliant pin 30a may be provided with one or more flanges. Similarly, the compliant pin 32a has an end portion 84a which is embedded in the polymeric material of the housing 72a. The end portion 84a of the compliant pin 32a may be provided with one or more flanges.

The end portions 82a and 84a of the compliant pins 30a and 32a are electrically insulated by the polymeric material of the housing 72a. The end portion 82a of the compliant pin 30a is connected the resistance 94. The end portion 84a of the compliant pin 32a is connected with the rotary switch 18a.

In the embodiment of the invention illustrated in FIGS. 4 and 5, the electrical apparatus 10a includes the potentiometer 90. However, it is contemplated that many different types of electrical apparatus may be utilized rather than the potentiometer 90. For example, the electrical apparatus 10a may include an encoder. It is believed that the use of solderless electrical connections between electrical apparatus and the circuit board will enable the housing 72a to be made of relatively inexpensive polymeric materials which are not high temperature resistant.

From the above description of the invention, those skilled in the art will perceive improvements, changes and modifications. Such improvements, changes and modifications within the skill of the art are intended to be covered by the appended claims.

What is claimed is:

1. An electrical apparatus comprising:
a printed circuit board having a plurality of openings with conductive linings, said printed circuit board has first and second major sides, said printed circuit board includes a plurality of electrically conductive traces disposed on said second major side of said printed circuit board, each of said electrically conductive traces being electrically connected with one said conductive linings;
an electrical device disposed adjacent to said first major side of said printed circuit board and having a manually movable control element, said electrical device includes a housing formed of a polymeric material which melts at a temperature above about 200° Centigrade; and
a plurality of electrical current conducting compliant pins connected with said electrical device and press fitted into said openings in said printed circuit board, each of said compliant pins being disposed in contact with said conductive lining in one of said openings and providing an electrically conductive path between said lining and said electrical device, each of said complaint pins has a first end portion which is embedded in the polymeric material of said housing and is electrically insulated from an adjacent complaint pin by the polymeric material of said housing,
said electrical apparatus being free of solder connecting said compliant pins to conductive linings in the openings in the printed circuit board.

2. An electrical apparatus as set forth in claim 1 wherein each of said compliant pins has a second end portion which is disposed in one of said openings in said printed circuit board and does not project past said second major side of said printed circuit board.

3. An electrical apparatus as set forth in claim 1 wherein each one of said compliant pins has a flange which engages said first major side of said printed circuit board adjacent to one of said openings to block movement of said one of said compliant pins in a direction toward said second major side of said printed circuit board.

4. An electrical apparatus as set forth in claim 1 wherein said housing is spaced from said first major side of said printed circuit board and said compliant pins extend across a space between said first major side of said printed circuit board and said housing.

5. An electrical apparatus as set forth in claim 1 wherein said electrical device includes a push—push switch which is operable to effect movement of a window in a vehicle between open and closed conditions.

6. An electrical apparatus as set forth in claim 1 wherein said electrical device includes a potentiometer which is operable to vary intensity of light emitted by a source of light in a vehicle.

* * * * *